(12) United States Patent
Takano et al.

(10) Patent No.: US 7,976,893 B2
(45) Date of Patent: Jul. 12, 2011

(54) SUPERCONDUCTIVITY IN BORON-DOPED DIAMOND THIN FILM

(75) Inventors: Yoshihiko Takano, Ibaraki (JP); Masanori Nagao, Ibaraki (JP); Minoru Tachiki, Ibaraki (JP); Hiroshi Kawarada, Kanagawa (JP); Hitoshi Umezawa, Tokyo (JP); Kensaku Kobayashi, Tokyo (JP)

(73) Assignee: National Institute for Materials Science, Ibaraki (JP)

( * ) Notice: Subject to any disclaimer, the term of this patent is extended or adjusted under 35 U.S.C. 154(b) by 735 days.

(21) Appl. No.: 11/133,269

(22) Filed: May 20, 2005

(65) Prior Publication Data

US 2006/0035788 A1    Feb. 16, 2006

Related U.S. Application Data

(60) Provisional application No. 60/572,948, filed on May 21, 2004.

(51) Int. Cl.
*B05D 5/12* (2006.01)
*C23C 16/00* (2006.01)
*C23C 8/00* (2006.01)
*H05H 1/30* (2006.01)
*H05H 1/24* (2006.01)
*B01J 3/06* (2006.01)
*D01C 5/00* (2006.01)
*D01F 9/12* (2006.01)

(52) U.S. Cl. ............... 427/62; 427/255.28; 427/249.8; 427/575; 427/569; 427/585; 423/446; 423/447.3; 423/447.7

(58) Field of Classification Search ................ 423/446, 423/447.3, 447.2, 447.7; 505/100; 427/575, 427/585, 62, 255.28, 590, 249.7, 249.8; 117/929
See application file for complete search history.

(56) References Cited

U.S. PATENT DOCUMENTS

| | | | | |
|---|---|---|---|---|
| 5,698,328 A * | 12/1997 | Bunshah et al. | ............ | 428/408 |
| 5,747,118 A | 5/1998 | Bunshah et al. | | |
| 6,274,837 B1 * | 8/2001 | Windischmann et al. | . | 219/69.17 |
| 7,312,562 B2 * | 12/2007 | Dahl et al. | ............ | 313/311 |
| 2003/0131787 A1 * | 7/2003 | Linares et al. | ............ | 117/93 |
| 2003/0200914 A1 | 10/2003 | Noguchi et al. | | |

FOREIGN PATENT DOCUMENTS

EP    0 518 532    12/1992

OTHER PUBLICATIONS

Locher et al. Optical and electrical charachterization of boron-doped diamond films. Diamond and Related Materials 4 ( 1995) 678-683.*

(Continued)

*Primary Examiner* — Jerry Lorengo
*Assistant Examiner* — Noah S Wiese
(74) *Attorney, Agent, or Firm* — Wenderoth, Lind & Ponack, L.L.P.

(57) ABSTRACT

A heavily boron-doped diamond thin film having superconductivity is deposited by chemical vapor deposition using gas mixture of at least carbon compound and boron compound, including hydrogen. An advantage of the diamond thin film deposited by the chemical vapor deposition is that it can contain boron at high concentration, especially in (111) oriented films. The boron-doped diamond thin film deposited by the chemical vapor deposition shows the characteristics of typical type II superconductor.

10 Claims, 6 Drawing Sheets

OTHER PUBLICATIONS

Zhang et al. Characterization of heavily boron-doped diamond films. Diamond and Related Materials 5 (1996) 1288-1294.*

Bustarret et al. Optical and electronic properties of heavily boron-doped homo-expitaxial diamond. Phys. Stat. Sol. (a) 199, No. 1. p. 9-18.*

E. A. Eklmov et al., "Superconductivity in Diamond", Nature, vol. 428, pp. 542-545, Apr. 2004.

European Office Action for corresponding Application No. 05253160, dated Aug. 28, 2006.

Allowed claims of corresponding European Application No. 05253160.

Response to European Patent Office in corresponding European Application No. 05253160, dated Feb. 5, 2008.

Cifre et al., "Trimethylboron doping of CVD diamond thin films", Diamond and Related Materials 3, 1994, pp. 628-631.

* cited by examiner

SUPERCONDUCTIVITY IN BORON-DOPED DIAMOND THIN FILM

This application claims the benefit of Provisional Application No. 60/572,948, filed May 21, 2004.

BACKGROUND OF THE INVENTION

1. Field of the Invention

The present invention relates to a boron-doped diamond thin film having superconductivity.

2. Description of the Related Art

Diamond has always been adored as a jewel. What are even more fascinating about diamond are its outstanding physical properties; it is the hardest material ever known in the world with the highest thermal conductivity of 22 W/cmK. Pure diamond is an electrical insulator. However, with boron doping, it becomes a p-type semiconductor, with boron acting as a charge acceptor. It is a promising material for electrical applications such as high frequency and high power devices owing to its high breakdown field (>10 MV/cm) and high carrier mobility.

On the other hand, a heavily boron-doped diamond shows metallic conduction and it has been in use as eletrodes in the field of electrochemistry. Its physical properties, however, have remained largely unexplored, particularly at low temperatures. Therefore, the recent news of superconductivity at 2.3K in heavily boron-doped diamond synthesized by high pressure sintering was received with considerable surprise (E. A. Ekimov et al. "Superconductivity in diamond", Nature, vol. 428, pp. 542, Apr. 1, 2004). Opening up new possibilities for diamond-based electrical or electronic devices, a systematic investigation of these phenomena clearly needs to be achieved. However, the systematic investigation of these phenomena has not been conducted sufficiently yet.

SUMMARY OF THE INVENTION

In view of the foregoing, an object of this invention is to provide a new diamond thin film having superconductivity which can be applicable to actual electric or electronic devices.

In order to attain the above object, this invention provides in the first place a boron-doped diamond thin film deposited by chemical vapor deposition, having superconductivity.

Secondly, this invention provides the boron-doped diamond thin film according to the first invention, wherein the chemical vapor deposition is carried out using gas mixture of at least carbon compound and boron compound, including hydrogen.

Thirdly, this invention provides the boron-doped diamond thin film according to the first invention, wherein the chemical vapor deposition is carried out under condition of microwave plasma deposition.

The boron-doped diamond of this invention exhibits superconductivity and it has a thin film morphology because of using chemical vapor deposition. Accordingly, it is expected that the boron-doped diamond thin film of this invention is applicable to actual electric or electronic devices.

BRIEF DESCRIEIIMON OF THE DRAWINGS

DETAILED DESCRIPTION OF THE PREFERRED EMBODIMENTS

Figure 1A:
FIG. 1a is a view showing a scanning electron microscope (SEM) image of the thin film deposited by microwave plasma chemical vapor deposition (MPCVD)

Hereinafter, preferred embodiments of this invention will described in detail.

A boron-doped diamond thin film of this invention is deposited by chemical vapor deposition and it exhibits superconductivity. Typically, the thin film of this invention has superconducting transition temperature (Tc) of 11.4K onset. It will be expected to realize the boron-doped diamond thin film having cosiderably higher superconducting temperature than the above temperature. The thin film is typically (111) orientated, although not restrictive. For example, the thin film may be (100) orientated, (110) orientated, and the like. Especially in the (111) oriented thin film, boron can be doped at a rate of about one order higher than in (001) oriented thin film. Accordingly, it is excellent in view of the exhibition of the superconductivity.

The boron-doped diamond thin film of this invention is deposited by using chemical vapor deposition. Especially, a microwave plasma chemical deposition (MPCVD) is preferably used. The conditions of the deposition are as follows.

Plasma chemical vapor deposition is carried out by using gas mixture of at least carbon compound and boron compound, including hydrogen. As the carbon compound, there may be used various materials including carbon, such as methane, ethane, propane, ethanol and the like. As the boron compound, there may be used various materials including boron, such as diborane ($B_2H_6$), trimethyl boron ($B(CH_3)_3$), boron oxide ($B_2O_3$), boric acid (metaboric acid, orthoboric acid, tetraboric acid, etc), solid boron (B), and the like. B/C ratio of the gas mixture is preferably in the range of 100 ppm-100000 ppm, and more preferably in the range of 1000 ppm-24000 ppm, although not restrictive. The carbon concentration in the hydrogen is preferably in the range of 0.1 at. % -10 at. %, although not restrictive. Such ratios may be determined, for example, in consideration of the exhibition of excellent superconductivity and quality of deposited diamond thin film.

Also, the chamber pressure of the deposition, substrate temperature, deposition time, and the like of the deposition may be determined, for example, in consideration of the exhibition of excellent superconductivity and quality of deposited diamond thin film.

The configurations of a chemical vapor deposition apparatus and a reactor are not limited.

The following nonlimiting examples are provided to illustrate this invention in detail.

EXAMPLES

The heavily boron-doped polycrystalline diamond thin film was deposited on a silicon (001) substrate using microwave plasma chemical vapor deposition (MPCVD) method.

The silicon substrate was pretreated by ultrasonic wave using diamond powder. Deposition was carried out under the condition of 50 Torr chamber pressure, 500 W microwave power and 800-900° C. substrate temperature using dilute gas mixture of methane and trimethylboron (TMB) in hydrogen. Methane concentration was 1 at. % in hydrogen with B/C ratio of 2500 ppm. After 9 hour-deposition, a film of 3.5 μm thickness was obtained.

Figure 1B:
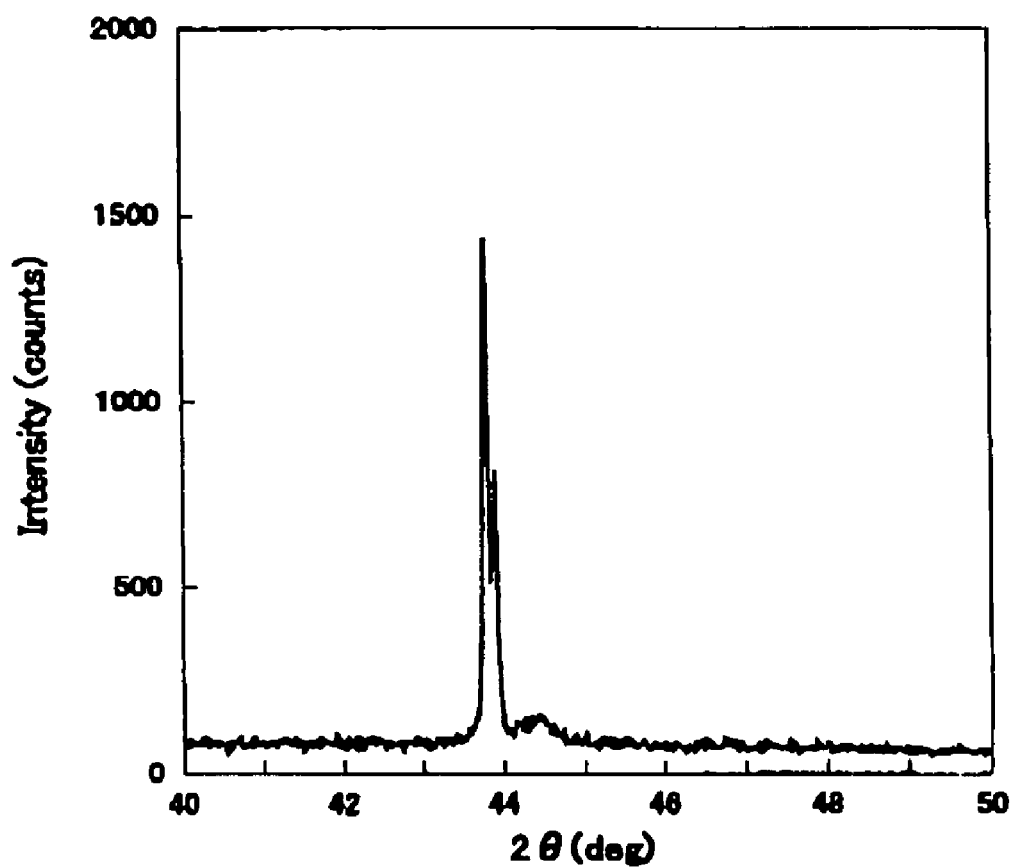
FIG. 1b is a view showing X-ray diffraction pattern of the thin film, obtained using CuKα radiation.

Scanning electron microscope (SEM) image of the thin film is shown in FIG. 1a. The film morphology reveals to consist predominantly of [111] facets with a mean grain size or 1 μm. The X-ray diffraction pattern was obtained with CuKα radiation (wavelength =0.154 nm). A sharp peak was detected at 2θ=43.9 degrees corresponding to the (111) refraction of cubic cell of diamond structure, as shown in FIG. 1b. Scarce detections of (220), (311) and (400) peaks suggest the [111] textured growth of the film.

Figure 2A:
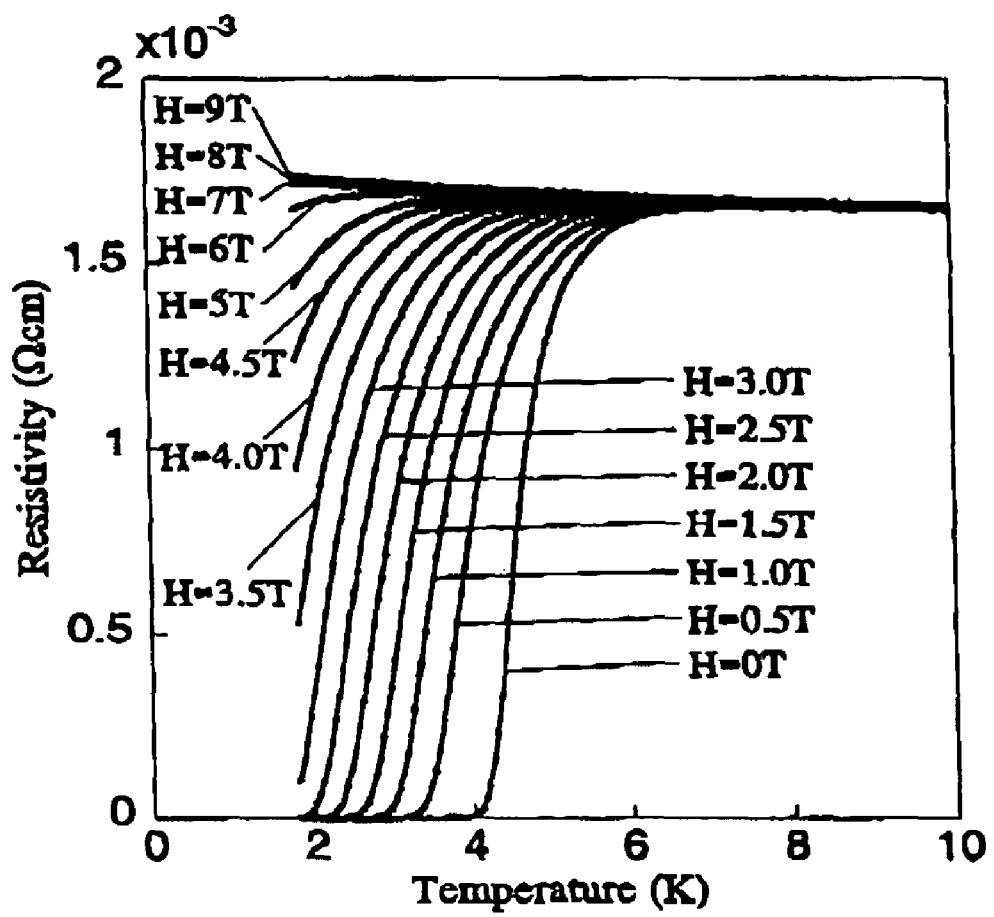
FIG. 2a is a view showing a temperature dependence of resistivity of the thin film under several values of magnetic fields.
Figure 2B:
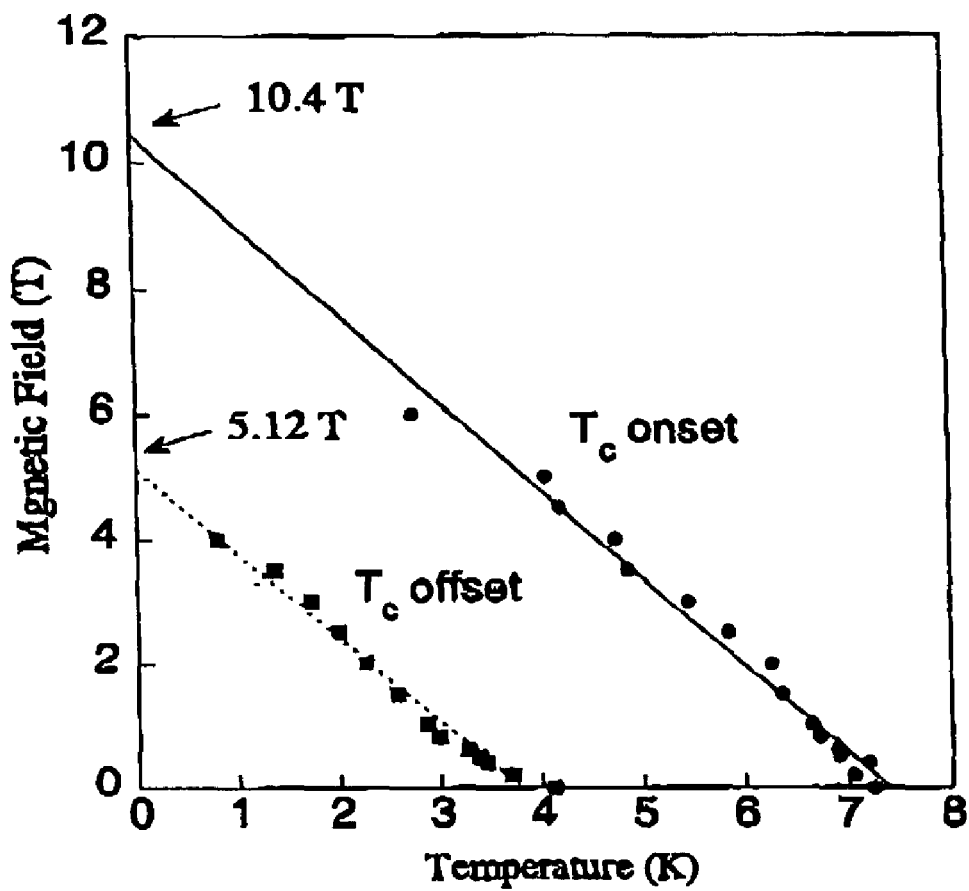
FIG. 2b is a view showing a field dependence of the onsets and offsets of Tc of the thin film.

The transport properties were measured between room temperature and 1.7K. FIG. 2a shows the temperature dependence of resistivity of the thin film under several values of magnetic fields up to 9 T. With decreasing temperature, the resistivity initially decreases slightly but increases gradualy beow 200K. The resistivity began to drop at around 7K which corresponds to the onset of a superconducting transition, and dropped to zero at around 4.2K (Tc offset) in the absent of the field. The superconducting transition temperature is shifted with the increasing of the applied field. The field dependence of the onsets and offsets of Tc are plotted in FIG. 2b. The extrapolation of Tc onset approaches the value of 10.4 T. Assuming the dirty limit, the upper critical field $Hc_2$ is estimated to be 7 T. This value is roughly similar to the $Hc_2$ of c-axis direction in $MgB_2$. The Irreversibility field is found to be 5.12 T at 0K. We have also confirmed reproducibility of superconductivity in different samples, such as a (100) orientated thin film with Tc of around at 2.6K.

Figure 3A:
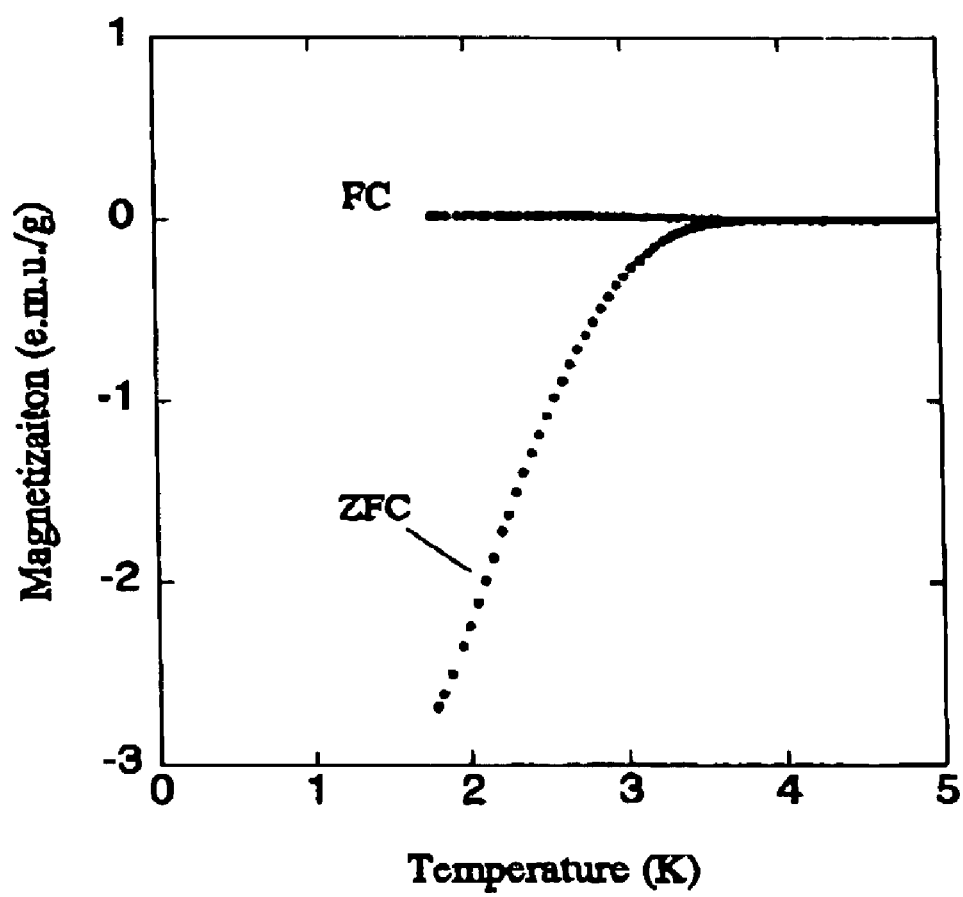
FIG. 3a is a view showing a temperature dependence of magnetization of the thin film.

The magnetization properties were measured by a superconducting quantum interface device (SQUID) magnetometer down to 1.78K. The temperature dependence of the magnetization is plotted in FIG. 3a. Diamagnetic signals corresponding to superconductivity appeared below 4K where the resistance drops to zero. The large difference between the zero-field cooling (ZFC) and field cooling (FC) curvatures indicates that the material has a fairly large flux pinning force resulting in the trapping of magnetic flux in the field cooling condition.

Figure 3B:
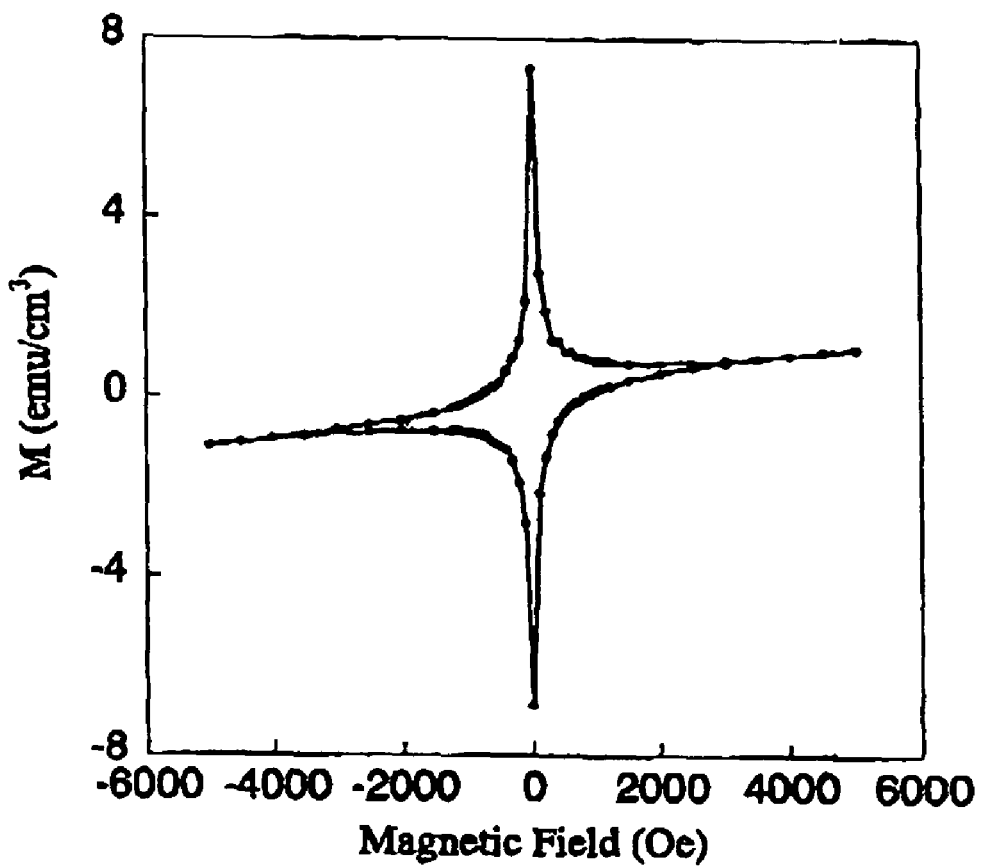
FIG. 3b is a view showing a magnetization versus magnetic field (M-H) curvature obtained at 1.8K.

Magnetization versus magnetic field (M-H) curvature obtained at 1.8K was plotted in FIG. 3b. Large symmetric hysteresis curvature shows the characteristics of typical type II superconductor. From the hysteresis of the magnetization curve, $\Delta M$ (emu/cm$^3$), we can estimate critical current density $J_c$ on the assumption of a critical-state model with the simple formula, $J_c=30\times\Delta M/d$, where d is the size of the sample. The $J_c$ at 0 T is estimated to be 200 A/cm$^2$. The hardest superconducting wires will be fabricated.

Based on Hall effect measurements, we estimate the carrier concentration of our sample to be $9.4\times10^{20}$/cm$^3$, which corresponds to a boron doping rate of 0.53%. In fact we have confirmed superconductivity in samples with doping rates as low as 0.18%. These values are considerably lower than those reported for materials sintered at high pressure.

The invention claimed is:

1. A boron-doped, (111) oriented diamond thin film superconductor, deposited on a (001) oriented substrate by chemical vapor deposition, which has a boron doping rate of 0.18 mole % or more.

2. The boron-doped, (111) oriented diamond thin film superconductor according to claim 1, wherein the chemical vapor deposition is carried out using a gas mixture of at least a carbon compound, a boron compound and hydrogen.

3. The boron-doped, (111) oriented diamond thin film superconductor according to claim 1, wherein said chemical vapor deposition is microwave plasma deposition.

4. The boron-doped, (111) oriented diamond thin film superconductor according to claim 1, wherein the (001) oriented substrate is (001) oriented silicon substrate.

5. A method of manufacturing a boron-doped, (111) oriented diamond thin film superconductor, comprising forming on a (001) oriented substrate by chemical vapor deposition a (111) oriented diamond thin film semiconductor having a boron doping rate of 0.18 mole % or more.

6. The method of manufacturing a boron-doped, (111) oriented diamond thin film superconductor according to claim 5, wherein the chemical vapor deposition is carried out using a gas mixture of at least a carbon compound, a boron compound and hydrogen.

7. The method of manufacturing a boron-doped, (111) oriented diamond thin film superconductor according to claim 5, wherein said chemical vapor deposition is microwave plasma deposition.

8. The method of manufacturing a boron-doped, (111) oriented diamond thin film superconductor according to claim 6, wherein B/C ratio of the gas mixture is in the range of 100 ppm-100,000 ppm.

9. The method of manufacturing a boron-doped, (111) oriented diamond thin film superconductor according to claim 6, wherein the boron compound is one compound selected from the group consisting of diborane, trimethyl boron, boron oxide, boric acid and solid boron.

10. The method of manufacturing a boron-doped, (111) oriented diamond thin film superconductor according to claim 5, wherein the (001) oriented substrate is a (001) oriented silicon substrate.

* * * * *